US011450830B2

(12) United States Patent
Kurata

(10) Patent No.: US 11,450,830 B2
(45) Date of Patent: Sep. 20, 2022

(54) SEMICONDUCTOR DEVICE AND DISPLAY DEVICE

(71) Applicant: Japan Display Inc., Tokyo (JP)

(72) Inventor: Kohei Kurata, Tokyo (JP)

(73) Assignee: Japan Display Inc., Tokyo (JP)

( * ) Notice: Subject to any disclaimer, the term of this patent is extended or adjusted under 35 U.S.C. 154(b) by 81 days.

(21) Appl. No.: 16/747,045

(22) Filed: Jan. 20, 2020

(65) Prior Publication Data

US 2020/0152905 A1 May 14, 2020

Related U.S. Application Data

(63) Continuation of application No. PCT/JP2018/022550, filed on Jun. 13, 2018.

(30) Foreign Application Priority Data

Aug. 28, 2017 (JP) .............................. JP2017-163113

(51) Int. Cl.
*H01L 51/52* (2006.01)
*H01L 27/32* (2006.01)
(Continued)

(52) U.S. Cl.
CPC ........ *H01L 51/5209* (2013.01); *G02F 1/1343* (2013.01); *G09F 9/30* (2013.01);
(Continued)

(58) Field of Classification Search
CPC ............... H01L 51/5209; H01L 27/326; H01L 27/3248; H01L 27/3265; H01L 51/0023;
(Continued)

(56) References Cited

U.S. PATENT DOCUMENTS

2002/0014837 A1\* 2/2002 Kim ..................... G09G 3/3216
313/505
2005/0168672 A1 8/2005 Tashiro et al.
(Continued)

FOREIGN PATENT DOCUMENTS

JP 2005-077526 A 3/2005
JP 2005-215586 A 8/2005

OTHER PUBLICATIONS

International Search Report dated Sep. 18, 2018 for the corresponding PCT Application No. PCT/JP2018/022550, with English translation.
(Continued)

*Primary Examiner* — Ahmed N Sefer
(74) *Attorney, Agent, or Firm* — Michael Best & Friedrich LLP

(57) ABSTRACT

A semiconductor device including a region arranged with a plurality of electrodes in a matrix, wherein the plurality of electrodes includes a plurality of first electrodes located along any one side of the region and a plurality of second electrodes located closer to the center of the region than the plurality of first electrodes, the first electrode and the second electrode have a different outline in a planar view, and the outline of the plurality of first electrodes includes a side having a zigzag shaped side or concave/convex shape.

15 Claims, 18 Drawing Sheets

(51) Int. Cl.
*G09F 9/30* (2006.01)
*H05B 33/26* (2006.01)
*H05B 33/14* (2006.01)
*H05B 33/12* (2006.01)
*G02F 1/1343* (2006.01)
*H01L 51/00* (2006.01)

(52) U.S. Cl.
CPC ........ *H01L 27/326* (2013.01); *H01L 51/5218* (2013.01); *H05B 33/12* (2013.01); *H05B 33/14* (2013.01); *H05B 33/26* (2013.01); *H01L 27/3248* (2013.01); *H01L 27/3265* (2013.01); *H01L 51/0023* (2013.01)

(58) Field of Classification Search
CPC ....... H01L 2227/323; H01L 2251/5315; H01L 2251/5392; H01L 51/5218; G02F 1/1343; G09F 9/30; H05B 33/12; H05B 33/14; H05B 33/22; H05B 33/26; H05B 33/28
See application file for complete search history.

(56) References Cited

U.S. PATENT DOCUMENTS

| 2006/0267491 | A1* | 11/2006 | Koo | H01L 27/3265 313/511 |
| 2017/0090633 | A1* | 3/2017 | Kwon | G06F 3/04166 |
| 2018/0196558 | A1* | 7/2018 | Wang | G02F 1/1343 |
| 2020/0227497 | A1* | 7/2020 | Kajiyama | H01L 27/3262 |

OTHER PUBLICATIONS

Written Opinion of the International Searching Authority dated Sep. 18, 2018 for the corresponding PCT Application No. PCT/JP2018/022550.

* cited by examiner

SEMICONDUCTOR DEVICE AND DISPLAY DEVICE

CROSS REFERENCE TO RELATED APPLICATIONS

This application is based upon and claims the benefit of priority from the prior Japanese Patent Application No. 2017-163113, filed on Aug. 28, 2017, and PCT Application No. PCT/JP2018/022550 filed on Jun. 13, 2018, the entire contents of which are incorporated herein by reference.

FIELD

The present invention is related to a display device. In particular, the present invention is related to an organic EL display device including an organic EL (electroluminescence) element as a display element.

BACKGROUND

In recent years, an organic EL display device is attracting attention as a display for use in a display screen of a mobile terminal or the like. An organic EL display device has an advantage in which the contrast characteristics and viewing angle characteristics are better than those of a liquid crystal display device. As a result, the development of an organic EL display device is accelerating as a display which can replace a liquid crystal display device.

The organic EL element arranged in the organic EL display device has a structure in which an organic EL material is provided is arranged as a light emitting material between an anode and a cathode. An organic EL element emits light by applying a voltage to an organic EL material using an anode and a cathode. Currently, organic EL elements which have a structure for extracting light from the cathode side are mainly used. In this case, in order to increase luminous efficiency, a highly reflective metal material is used for the anode. In recent years, an organic EL display device which uses silver and a silver alloy as a reflective electrode has been developed (for example, Japanese Laid Open Patent Publication 2005-77526).

SUMMARY

A semiconductor device related to one embodiment includes a region arranged with a plurality of electrodes in a matrix, wherein the plurality of electrodes includes a plurality of first electrodes located along any one side of the region and a plurality of second electrodes located closer to the center of the region than the plurality of first electrodes, the first electrode and the second electrode have a different outline in a planar view, and the outline of the plurality of first electrodes includes a side having a zigzag shaped side or concave/convex shape.

A display device related to one embodiment includes a pixel region having a plurality of pixel electrodes arranged in a matrix, wherein the plurality of pixel electrodes includes a plurality of first pixel electrodes located along any one side of the region and a plurality of second pixel electrodes located closer to the center of the region than the plurality of first pixel electrodes, the first pixel electrode and the second pixel electrode have a different outline in a planar view, and the outline of the plurality of first pixel electrodes includes a side having a zigzag shaped side or concave/convex shape.

DESCRIPTION OF EMBODIMENTS

Figure 1:
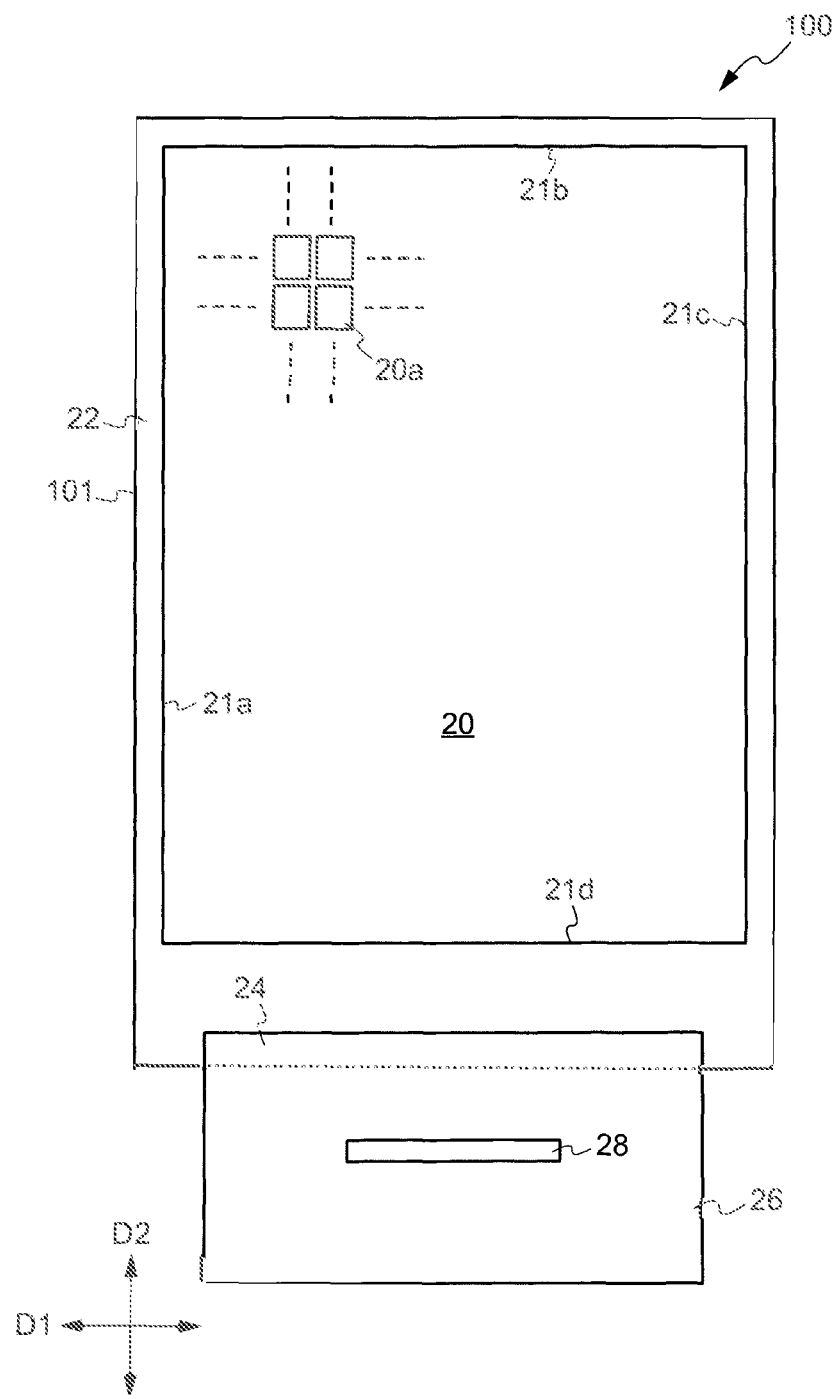
FIG. 1 is a planar diagram showing a structure of an organic EL display device according to one embodiment of the present invention.

Although silver and silver alloys have the advantage of high reflectivity, they have the disadvantage of being difficult to control when used during etching. For example, since the ionization tendency of silver is small, a wet etching process using an etchant which has a strong oxidizing power is used for silver etching. As a result, in the case when a silver thin film is etched by wet etching on a substrate, it is necessary to consider the influence on other materials. Because of such circumstances, when etching a silver thin film in order to improve the controllability of the etching process, a method is adopted of flowing an etching solution on the substrate while the substrate is tilted.

However, in the case when such a method is used, a residue (silver residue remaining without being etched) may be produced after the silver is etched. For example, when an anode electrode is formed by subjecting a silver thin film to a wet etching process, if a residue is produced between the anode electrodes, a short circuit may occur between adjacent anode electrodes. As a measure to prevent residues after etching, although it is thought possible to keep the substrate on which the silver thin film is formed horizontal and keep the etching solution on the substrate for a long time, it cannot be said to be a method which is desirable considering the effects on other materials. Therefore, there is demand for the development of a method for reducing residue after etching assuming the method used is the method of flowing an etching solution on a substrate while the substrate is tilted.

One objects of the present invention is to prevent operation defects of a display device due to residue after etching during formation of an electrode.

The embodiments of the present invention are explained below while referring to the diagrams. However, it is possible to perform the present invention using various different forms, and the present invention should not be limited to the content described in the embodiments exemplified herein.

In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification and the scope of the patent claims, when expressing a mode in which another structure is arranged above a certain structure, in the case where it is simply described as [above], unless otherwise noted, a case where another structure is arranged directly above a certain structure as if in contact with that structure, and a case where another structure is arranged via another structure above a certain structure, are both included.

In addition, in the present specification and scope of the patent claims, [upper] and [lower] in a cross-sectional view of a display device refer to the relative positional relationship with respect to surfaces on the side of the substrate on which an electrooptic element is formed (referred to simply as "surface" herein). For example, in the present specification, for the convenience of explanation, the direction from the surface of a substrate toward an electrooptic element is referred to as [up], and the opposite direction is referred to as [below]. In addition, [upper] and [lower] in a planar view of a pixel region indicates [upper] and [lower] in the case when a diagram is viewed from the front.

[Display device] refers to a structure which displays an image using an electrooptical layer. For example, the term display device may sometimes refer to a display cell which includes an electrooptical layer, or to a structure in which another optical member (for example, a polarization member, a backlight, a touch panel or the like) is attached to a display cell. Here, as long as there is no technical contradiction which occurs, an [electrooptical layer] may include a liquid crystal layer, an electroluminescence (EL) layer, an electrochromic (EC) layer and an electrophoretic layer. Therefore, although an embodiment described herein is explained by exemplifying an organic EL display device including an organic EL layer as a display device, this does not exclude application to a display device including another of the electrooptical layers described above.

First Embodiment

Display Device Structure

In the present embodiment, an organic EL display device is explained as an example of a display device. The organic EL display device is a display device which uses an organic EL element as an electrooptical element.

FIG. 1 is a planar view showing a structure of an organic EL display device 100 of the first embodiment. In FIG. 1, an array substrate 101 is a substrate in which a plurality of pixels including organic EL elements are formed on the surface side of a support substrate (not shown in the diagram). The array substrate 101 may also be called an active matrix substrate.

The array substrate 101 includes a pixel region 20 and a periphery region 22. A plurality of pixels 20a including an organic EL element are arranged in the pixel region 20. Specifically, the pixels 20a are arranged in a matrix shape as a whole in the direction D1 (row direction) and the direction D2 (column direction) shown in FIG. 1. In the periphery region 22, a circuit (for example, a shift-register circuit) which transmits a signal to a pixel 20a is arranged. However, in the present embodiment, there is no particular limitation to what type of circuit is arranged in the periphery region 22. Furthermore, the pixel area 20 may be arranged not only with pixels which actually contribute to image display, but also dummy pixels may be arranged which do not contribute to image display. In this case, a region arranged with pixels which contribute to image display may be called a display region.

The array substrate 101 includes a terminal region 24 as a part of the periphery region 22. A plurality of wirings are collected in the terminal region 24, and a flexible printed circuit substrate 26 is electrically connected to the wirings. A signal (for example, an image video signal) which is transmitted from an external device (not shown in the diagram) via the flexible printed circuit substrate 26 is transmitted to a pixel 20a via a plurality of wirings (not shown in the diagram) which extend from the terminal region 24.

In the present embodiment, a drive circuit 28 formed from an IC chip or the like is mounted on the flexible printed circuit substrate 26. The drive circuit 28 has a role for transmitting a control signal such as a start pulse to a shift register circuit (not shown in the diagram) or the like arranged in the periphery region 22, and for performing predetermined signal processing of an image signal. However, the drive circuit 28 is not an essential part of the structure and can be omitted.

Next, the structure of the pixel 20a of the organic EL display device 100 in the present embodiment is explained. The pixel 20a shown in FIG. 1 is actually formed form three subpixels corresponding to three colors of RGB. However, for the convenience of explanation, one subpixel is explained here.

Figure 2:
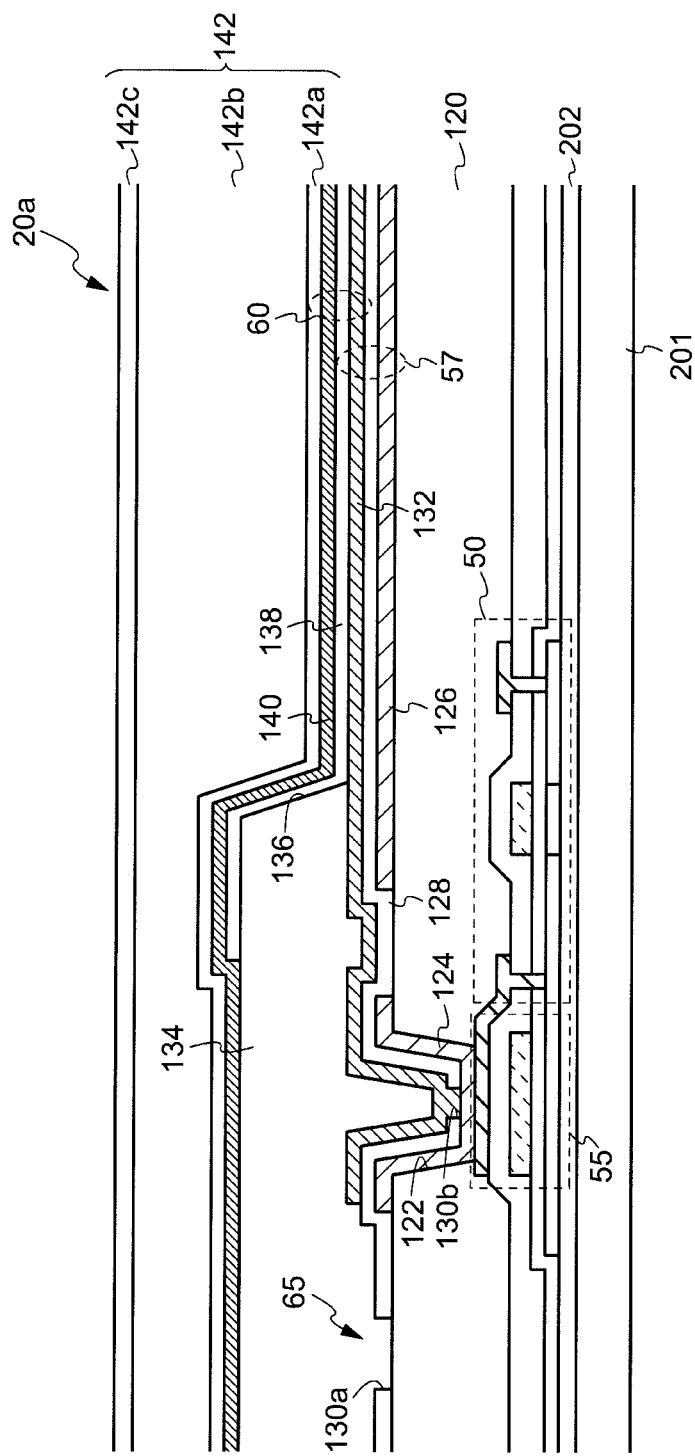
FIG. 2 is a cross-sectional diagram showing a structure of a pixel according to one embodiment of the present invention.

FIG. 2 is a cross-sectional view showing the structure of the pixel 20a in the first embodiment. In FIG. 2, a thin film transistor 50 is arranged above a support substrate 201 interposed by a base film 202. Although a glass substrate is used as the support substrate 201 in the present embodiment, a substrate made of a resin material such as acrylic or polyimide may also be used. An inorganic insulating film such as a silicon oxide film, a silicon nitride film or a silicon oxynitride film is used as the base film 202.

The thin film transistor 50 is a so-called top gate type thin film transistor. However, the present invention is not limited to this, and any type of thin film transistor may be arranged. The thin film transistor 50 shown in FIG. 2 functions as a drive transistor for supplying a current to the organic EL element 60. In addition, in the present embodiment, an N-channel transistor is used as the thin film transistor 50. Furthermore, since the structure of the thin film transistor 50 is a known structure, a detailed explanation is omitted here.

The storage capacitor 55 is connected to the thin film transistor 50. The storage capacitor 55 can be formed by utilizing two conductive films constituting which form the thin film transistor 50 and an insulating film arranged therebetween. For example, the storage capacitor 55 of the present embodiment can be formed using a semiconductor layer which forms an active layer of the thin film transistor 50, a gate insulating film and a capacitor electrode (an electrode formed at the same time as the gate electrode). However, the structure of the storage capacitor 55 is not limited to this.

The thin film transistor 50 is covered by an organic insulating film 120. The organic insulating film 120 functions as a planarization film which planarizes unevenness caused by the shape of the thin film transistor 50. In the present embodiment, an insulating film including a resin material such as an acrylic resin or a polyimide resin is used as the organic insulating film 120.

An opening part 122 is arranged in the organic insulating film 120. The opening part 122 is covered by an oxide conductive film 124. In the present embodiment, the oxide conductive film 124 is formed by patterning a thin film formed from a metal oxide material such as ITO (Indium Tin Oxide) or IZO (Indium Zinc Oxide). However, the present invention is not limited to this, and another oxide conductive film may be used as the oxide conductive film 124. The oxide conductive film 124 is connected to a part (specifically, a source electrode) of the thin film transistor 50 which is exposed by the opening part 122.

Furthermore, a lower electrode 126 of the storage capacitor 57 is formed on the upper surface of the organic insulating film 120 using another oxide conductive film which is formed simultaneously with the oxide conductive film 124. The lower electrode 126 is arranged below the organic EL element 60. As is described herein, since the organic EL element 60 of the present embodiment has a structure in which light is emitted upwards, it is possible to form the storage capacitor 57 using a space below the organic EL element 60.

Furthermore, although not shown in FIG. 2, the oxide conductive film 124 and the oxide conductive film used for forming the the lower electrode 126 of the storage capacitor 57 can be used for separate purposes (for example, wiring). At this time, wiring resistance can also be lowered by overlapping a metal film on the oxide conductive film which is used as wiring. Since an oxide conductive film which forms a metal oxide has a higher resistance than a metal film, in the case when it is used as a wiring, it is preferred to overlap a metal film in order to lower the resistance as a whole. At this time, the oxide conductive film 124 described above also functions as a protective film which protects the source electrode of the thin film transistor 50 from an etching gas when forming the metal film.

An inorganic insulating film 128 is arranged the oxide conductive film 124 and above the lower electrode 126. In the present embodiment, although a silicon nitride film is used as the inorganic insulating film 128, the present invention is not limited to this, and other inorganic insulating films such as a silicon oxide film and a silicon oxynitride film can also be used. The inorganic insulating film 128 is arranged with an opening part 130a which exposes the organic insulating film 120. The opening part 130a functions as a drain region 65. The drain region 65 plays the role of releasing moisture which is generated from the organic insulating film 120 to the exterior by a heating process after forming the organic insulating film 120.

A pixel electrode 132 is arranged above the inorganic insulating film 128. The pixel electrode 132 is connected to the oxide conductive film 124 via the opening part 130b which is arranged in the inorganic insulating film 128. That is, the pixel electrode 132 is connected to the thin film transistor 50 via the oxide conductive film 124. In addition, the pixel electrode 132 functions as an upper electrode of the storage capacitor 57 and also functions as an anode electrode of the organic EL element 60.

Furthermore, as was described above, since a plurality of pixels 20a are arranged in a matrix in the pixel region 20, a plurality of pixel electrodes 132 are also arranged in a matrix in the pixel region 20. Although the outline of some of the pixel electrodes 132 is different from the outline of the other pixel electrodes 132 in the present embodiment, details with resect to this point are described later.

Figure 3:
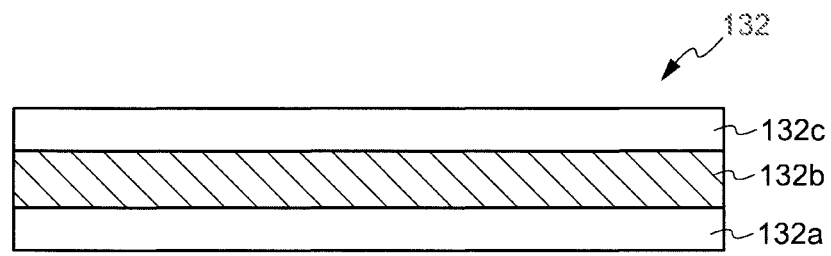
FIG. 3 is a cross-sectional diagram showing a structure of a pixel electrode according to one embodiment of the present invention.

In the present embodiment, a conductive film having a stacked layer structure in which a layer including silver is sandwiched between oxide conductive films is used as the pixel electrode 132. Specifically, as is shown in FIG. 3, the pixel electrode 132 is formed by an IZO layer 132a, a silver layer 132b, and an IZO layer 132c. However, it is possible to use an ITO layer instead of the IZO layers 132a and 132c. In order to obtain a structure in which light emitted from the organic EL element 60 is emitted upwards, it is desirable that the pixel electrode 132 includes a conductive film having reflectivity. As a result, in the present embodiment, a layer formed form a metal material containing silver or a silver alloy having a high reflectance is used for a part of the pixel electrode 132.

In addition, in the present embodiment, since the dielectric of the storage capacitor 57 is a silicon nitride film having a higher dielectric constant than other insulating films, it has the advantage that a large capacity can be easily secured. Further, since the space below the organic EL element 60 can be effectively utilized, there is an advantage that it is possible to increase the area which can be used as the storage capacitor 57.

A part of the pixel electrode 132 is covered by a bank 134 formed from an organic material. Specifically, the bank 134 covers an end part of the pixel electrode 132 and also includes an opening part 136 which exposes a part of the upper surface of the pixel electrode 132. A part of the exposed upper surface of the pixel electrode 132 serves as a substantial light emitting region of the pixel 20a. That is, the bank 134 has a role for defining a light emitting region of the pixel 20a. A resin material such as an acrylic resin or a polyimide resin can be used as an organic material constituting the bank 134 but is not limited thereto.

An organic EL layer 138 is arranged in a region (that is, a region on the inner side of the opening 136) which does not overlap the bank 134 on the upper surface of the pixel electrode 132. In the present embodiment, the organic EL layer 138 is formed by depositing an organic EL material by a vapor deposition method. The organic EL layer 138 includes at least a light emitting layer (not shown in the diagram), and can additionally include an electron injection layer, an electron transport layer, an electron blocking layer, a hole injection layer, a hole transport layer and/or a hole blocking layer. For example, it is possible to use an organic EL material which emits red, blue, or green light for the organic EL layer 138.

Furthermore, although a structure in which a light emitting layer having a different emission color for each pixel is exemplified in the present embodiment, the present invention is not limited to this structure. For example, although not shown in the diagram, it is possible to arrange an organic EL layer which emits white light over a plurality of pixels. In this case, white light is separated into each RGB color by a color filter arranged in each pixel. In addition, functional layers such as an electron injection layer, an electron transport layer, an electron blocking layer, a hole injection layer, a hole transport layer and a hole blocking layer may be arranged over a plurality of pixels.

A common electrode 140 formed from a conductive film containing an alkali metal or an alkaline earth metal is arranged above the organic EL layer 138. For example, magnesium (Mg), lithium (Li), or the like can be used as the alkali metal or alkaline earth metal. In the present embodiment, an MgAg film which is an alloy of magnesium and silver is used as the conductive film containing an alkaline earth metal. The common electrode 140 functions as a cathode electrode of the organic EL element 60. In addition, the common electrode 140 is arranged over a plurality of pixels.

In the case of a top emission type display device in which light emitted from the organic EL layer 138 is extracted to the upper surface side, that is, the common electrode 140 side, the common electrode 140 is required to have be translucent to light. In the case where the conductive film containing an alkali metal or alkaline earth metal described above is used as the common electrode 140, the thickness of the common electrode 140 is made sufficiently thin so that emitted light can to pass through in order to impart light translucency. Specifically, light translucency can be imparted by setting the film thickness of the common electrode 140 is 10 nm or more and 30 nm or less.

The organic EL element 60 is formed by the pixel electrode 132 described above, the organic EL layer 138 and common electrode 140.

A sealing film 142 is arranged above the common electrode 140 (that is, above the organic EL element 60). The sealing film 142 of the present embodiment includes has a three layer structure consisting of, in order from the bottom, a first sealing film 142a formed from an inorganic material, a second sealing film 142b formed from an organic material and a third sealing film 142c formed from an inorganic material. These sealing films play the role of preventing entry of moisture and the like from the outside and preventing deterioration of the organic EL layer 138 and the common electrode 140.

In the present embodiment, a silicon nitride film is used as the first sealing film 142a and the third sealing film 142c. However, the present invention is not limited to this and a silicon oxide film or a silicon oxynitride film may be used instead of the silicon nitride film. That is, it is possible to use an inorganic insulating film as the first sealing film 142a. It is particularly preferred to use an insulating film containing silicon nitride as the inorganic insulating film.

In addition, an organic insulating film formed from a resin material is used as the second sealing film 142b. In the present embodiment, by using an organic insulating film formed from a resin material as the second sealing film 142b, it is possible to planarize the unevenness formed by the banks 134. Since the first sealing film 142a has film thickness is around 1 μm, it is formed along an inclined surface of the bank 134. On the other hand, since the second sealing film 142b is formed with a film thickness of about 10 μm, a step such as the opening part 136 which is arranged in the bank 134 can be sufficiently filled. Therefore, by using an organic insulating film as the second sealing film 142b, it is possible to reduce the unevenness generated on the upper surface of the second sealing film 142b more than the unevenness generated on the upper surface of the first sealing film 142a.

Pixel Electrode Structure

As described above, in the present embodiment, the outline of a part of the pixel electrodes 132 is different from the outline of the other pixel electrodes 132. This point is explained below.

Figure 4A:
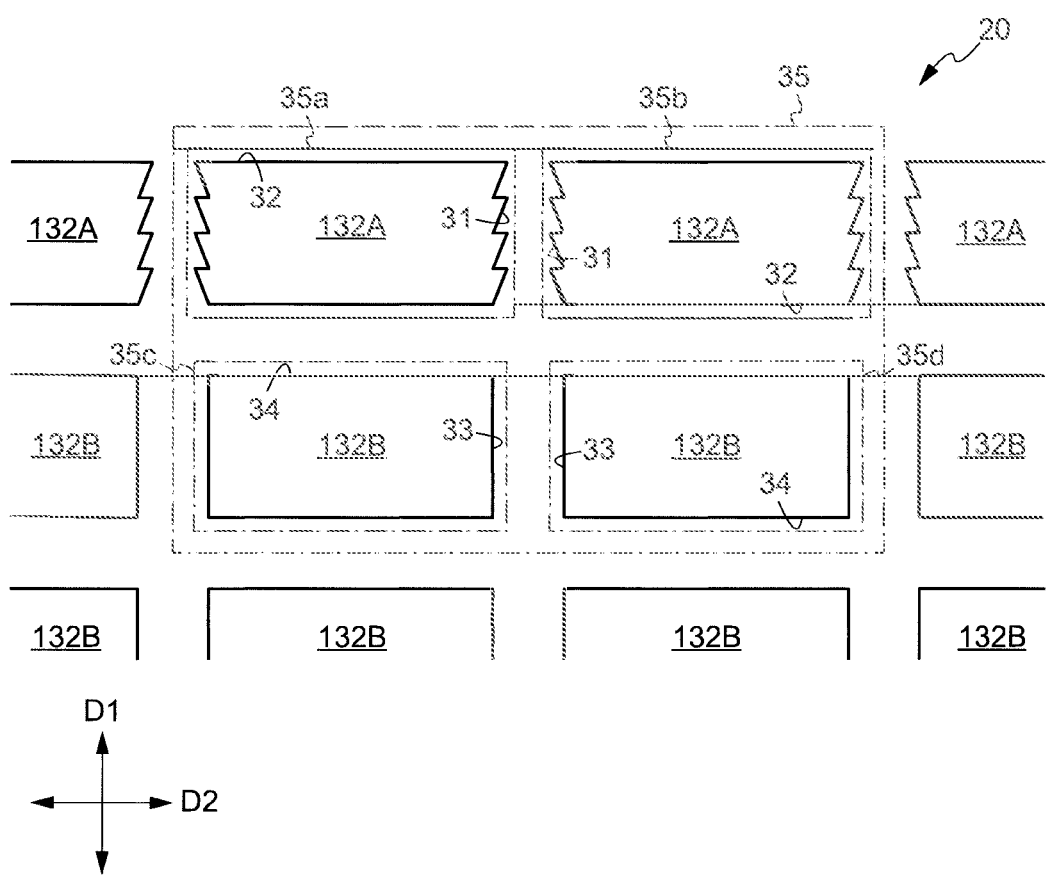
FIG. 4A is a planar diagram showing a structure of a pixel region according to one embodiment of the present invention.

FIG. 4A is a planar diagram showing a structure of the pixel region 20 in the first embodiment. Specifically, this corresponds to an enlarged diagram of the vicinity of a side 21a among the sides 21a to 21d which form the pixel region 20 in FIG. 1. Two types of pixel electrodes which have respectively different outlines in a planar view are arranged in the pixel region 20 of the organic EL display device 100. Specifically, the plurality of pixel electrodes include a plurality of first pixel electrodes 132A which are located along any one side of the sides 21a to 21d which form the pixel region 20, and a plurality of second pixel electrodes 132B located closer to the center side (lower side in the D1 direction in FIG. 4A) than the plurality of first pixel electrodes 132A.

The first pixel electrode 132A has a zigzag shaped side 31 in a part of the outline in a planar view. In the present embodiment, the zigzag shaped side 31 is arranged along the direction D1. The first pixel electrode 132A has a structure in which pairs of sides 31 which are processed in a zigzag shape face each other in the direction D2. Furthermore, in the outline of the first pixel electrode 132A, the side 32 which is along the second direction intersecting the first direction is a straight side. However, the side 32 is not required to be straight and may have an arbitrary shape.

The second pixel electrode 132B is formed by a straight side in the outline in a planar view. Specifically, both the side 33 along the direction D1 and the side 34 along the direction D2 are straight sides. However, the side 33 and the side 34 are not required to be straight and may have an arbitrary shape.

Here, the first pixel electrode 132A shown in FIG. 4A is located on the outermost periphery of the pixel region 20. That is, one of the sides 32 of the plurality of first pixel electrodes 132A forms the side 21a among the sides 21a to 21d of the pixel region 20 shown in FIG. 1. Furthermore, in the present embodiment, the first pixel electrode 132A is arranged along only the side 21a of the pixel region 20, and is not arranged along the sides 21b to 21d. However, it is sufficient that the first pixel electrode 132A is arranged on at least one side of the pixel region 20, and the first pixel electrode 132A may be arranged along other sides (for example, sides 21b to 21d). In the present embodiment, the first pixel electrode 132A is located on the most upstream side where the etching solution flows when forming the pixel electrode 132. This point is explained below.

Each of the plurality of pixel electrodes 132 in the present embodiment forms a subpixel. For example, in FIG. 4A, the subpixels 35a to 35d function as pixels corresponding to the four colors of red, green, blue and white respectively. In addition, these subpixels 35a to 35d are combined to function as a main pixel 35. In the present embodiment, since the subpixel on the outermost periphery of the pixel region 20 is the first pixel electrode 132A, the first pixel electrode 132A and the second pixel electrode 132B are mixed into one main pixel 35. However, the present invention is not limited to this, and a structure is possible in which the first pixel electrode 132A has a shape from the outermost periphery to the second row of the pixel region 20, or a pixel electrode which has a different outline may be arranged for each main pixel may be arranged. In addition, the types of subpixel which form a pixel are not limited to those described above.

Figure 4B:
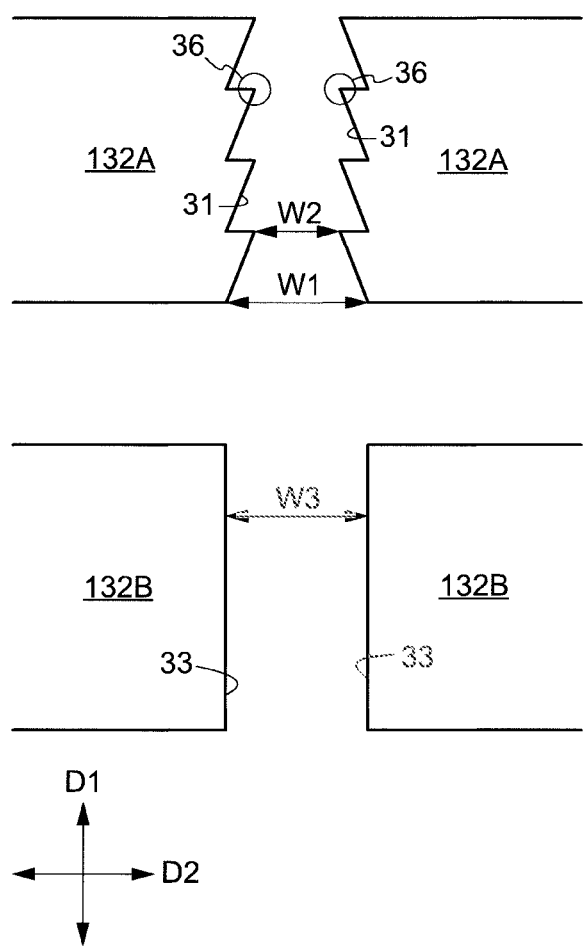
FIG. 4B is a planar diagram for explaining a shape of a pixel electrode according to one embodiment of the present invention.

FIG. 4B is a planar diagram for explaining the shape of the pixel electrode 132 in the first embodiment. As is shown in FIG. 4B, the first pixel electrode 132A has zigzag shaped sides 31 which face each other. As a result, the gap between two adjacent first pixel electrodes 132A has a first gap W1 and a second gap W2 which is narrower than the first gap W1. In addition, in the present embodiment, the zigzag shaped side 31 has a structure which includes a projecting part 36 which projects toward one side (side where the first pixel electrode 132A is arranged) of the pixel region 20.

This type of structure aims to reduce residue when the pixel electrode is formed by wet etching. As is explained herein, when the pixel electrode is formed, an etching solution is flowed from a predetermined direction to the substrate surface while the substrate to be processed is inclined. When the case in FIG. 4B is used as an example, the etching solution flows from above to below along the direction D1. The etching solution which flows at the time stays as long as possible in the gap between two adjacent first pixel electrodes 132A, and the side 31 of the first pixel electrode 132A of the present embodiment takes on a zigzag shape. Moreover, since the zigzag shaped side 31 includes the projection part 36 which protrudes so as to face the etching solution flow direction, it is possible to form in which the etching solution is collected in n the gap between the two adjacent first pixel electrodes 132A.

On the other hand, the side 33 of the second pixel electrode 132B has a straight shape. As a result, a gap W3 between the two adjacent second pixel electrodes 132B is constant. Furthermore, in the present embodiment, the width of the gap W1 is set to be equal to the width of the gap W3. That is, the gap W2 is narrower than the gap W3. In this way, in the present embodiment, the gap between the two adjacent first pixel electrodes 132A have a structure in which a part that is narrower than the gap between the two adjacent second pixel electrodes 132B. Since a narrow region exists between two adjacent first pixel electrodes 132A, the etching solution remains for a long time.

Furthermore, in the present embodiment, as is shown in FIGS. 4A and 4B, the gap between two adjacent first pixel electrodes 132A and the gap between two adjacent second pixel electrodes 132B are located in a straight line in the direction D1. That is, while the etching solution which forms a pixel electrode etches a layer containing silver or a silver alloy, the solution flows in a straight line from the upstream side to the downstream side along the direction D1 in FIG. 4A and FIG. 4B.

Figure 5:
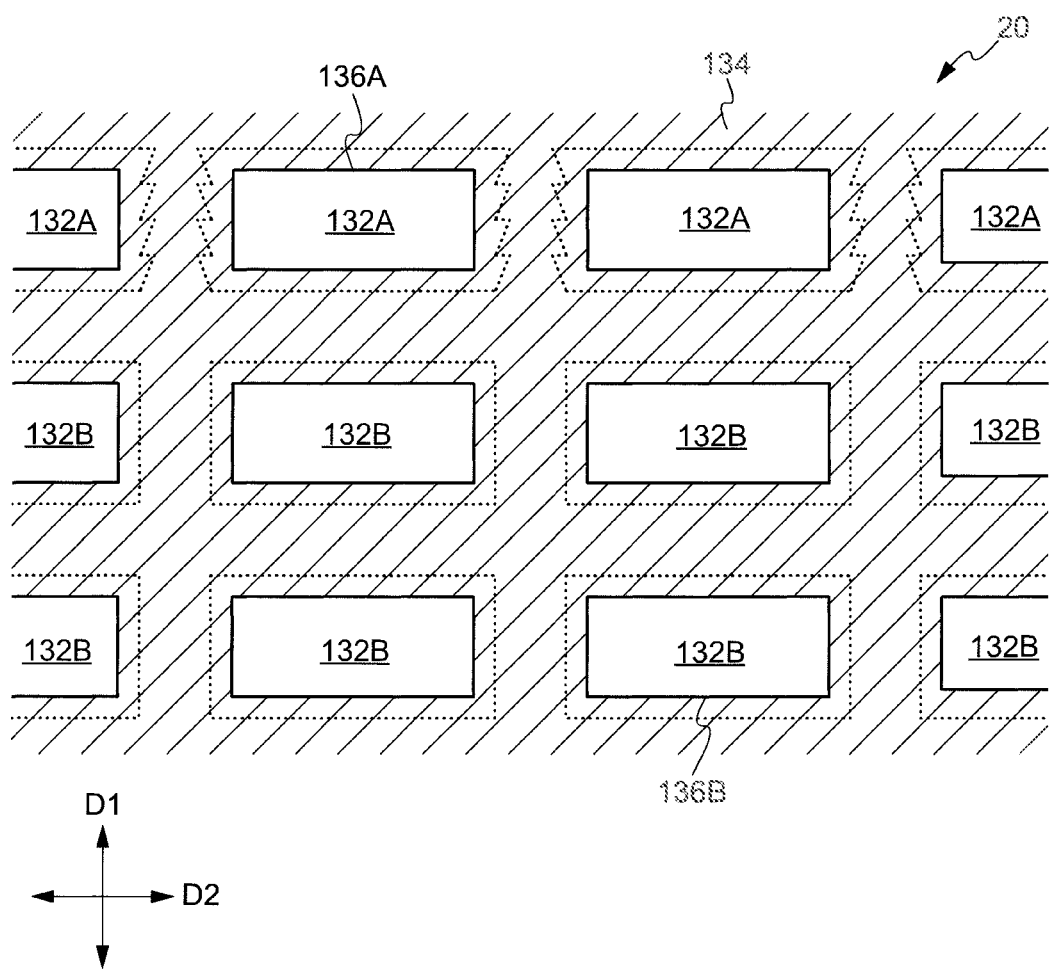
FIG. 5 is a planar diagram showing a positional relationship of pixel electrode and a bank according to one embodiment of the present invention.

In addition, as is shown in FIGS. 4A and 4B, although in the present embodiment, one side of the first pixel electrode 132A is processed in a zigzag shape, this shape has no influence in any way on the function as the pixel electrode. FIG. 5 is a planar diagram showing the positional relationship between the pixel electrode 132 and the bank 134 in the first embodiment. As a result, the bank 134 is arranged to cover the electrode 132A and the first opening part 134, and the second part 135), and effectively functions as anode electrode.

As is shown in FIG. 5, the first opening part 136A and the second opening part 136B have the same shape (that is, the same outline) in a planar view. In the present embodiment, when the first opening part 136A and the second opening part 36B are formed in the bank 134, the edges of the first part 36B and the second pixel electrode 132B are designed so they do not overlap the outline of the first opening part 136A and the second opening part 136B. That is, the outline of the first opening part 36A does not overlap the zigzag side shaped side 31 in the first pixel electrode 132A. As a result, the outline of first opening part 136A and the second opening part 136B can have the same outline without depending on the shapes of the first pixel electrode 132A and the second pixel electrode 1328. Of course, this is only an example, and the outlines of the first opening part 134 the second opening part may have different shapes.

In addition, in the present embodiment, although an example in which the side 31 has a zigzag shape has been explained, the present invention is not limited to this. For example, if the side does not have a zigzag shape but is an uneven side, then effect of collecting an etching solution described above can be obtained.

Strictly speaking, by forming one side of the first pixel electrode 132A in a zigzag shape, the regions of the first pixel electrode 132A and the second pixel electrode 1328 are different. When electrical control is focused on, since the difference in area produces a difference in capacitance value of the pixel electrode itself, a time constant when charging or discharging may be slightly different. In order to minimize this influence, it is preferred that the shape of the side 31 is determined so that the area difference of the first pixel electrode 132A is ±5% or less, or more preferably ±3% or less with respect to the second pixel electrode 1328.

Method for Manufacturing Organic EL Display Device

Figure 6:
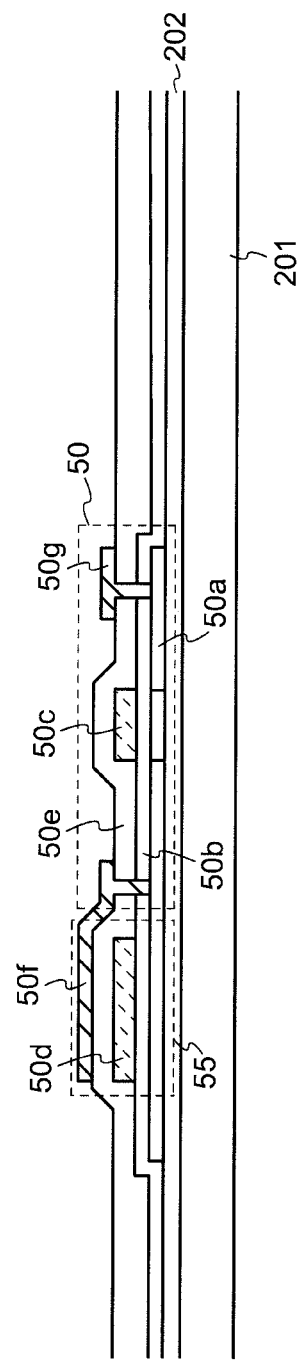
FIG. 6 is a cross-sectional diagram showing a manufacturing process of an EL display device according to one embodiment of the present invention.
Figure 7:
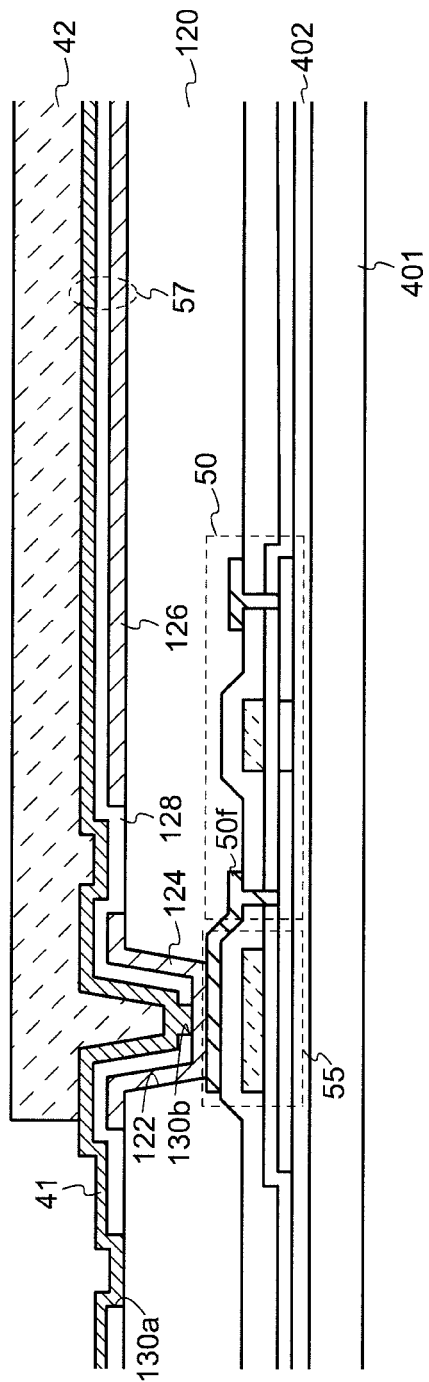
FIG. 7 is a cross-sectional diagram showing a manufacturing process of an EL display device according to one embodiment of the present invention.
Figure 8:
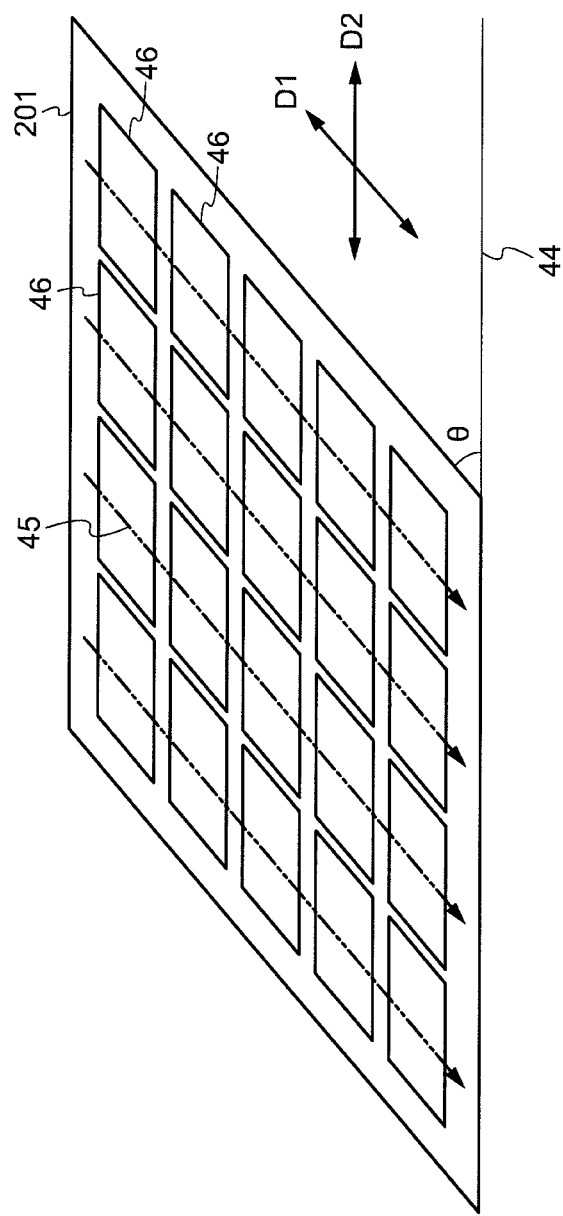
FIG. 8 is a diagram showing a manufacturing process of a pixel electrode according to one embodiment of the present invention.
Figure 9:
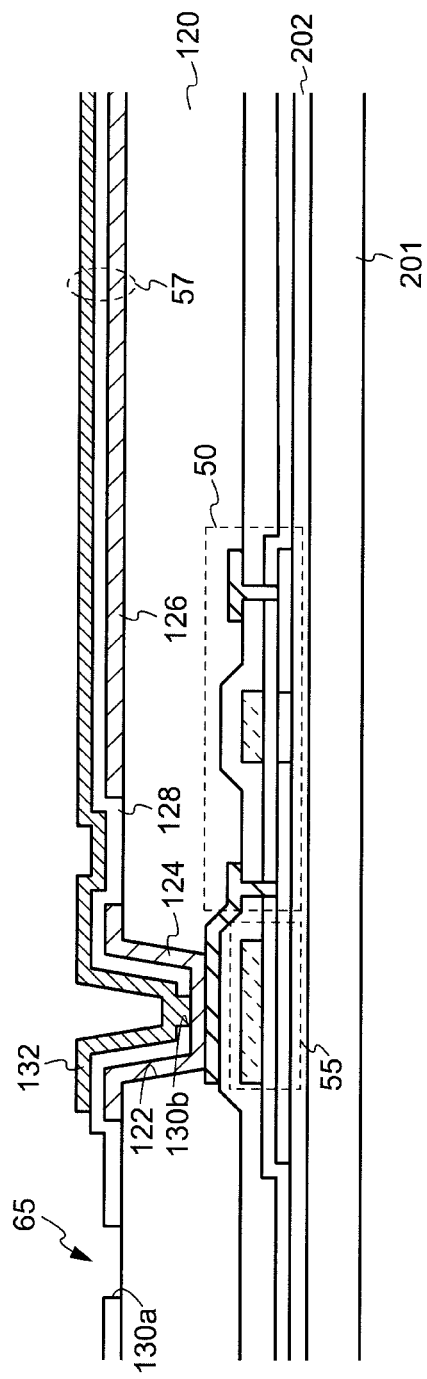
FIG. 9 is a cross-sectional diagram showing a manufacturing process of a display device according to one embodiment of the present invention.
Figure 10:
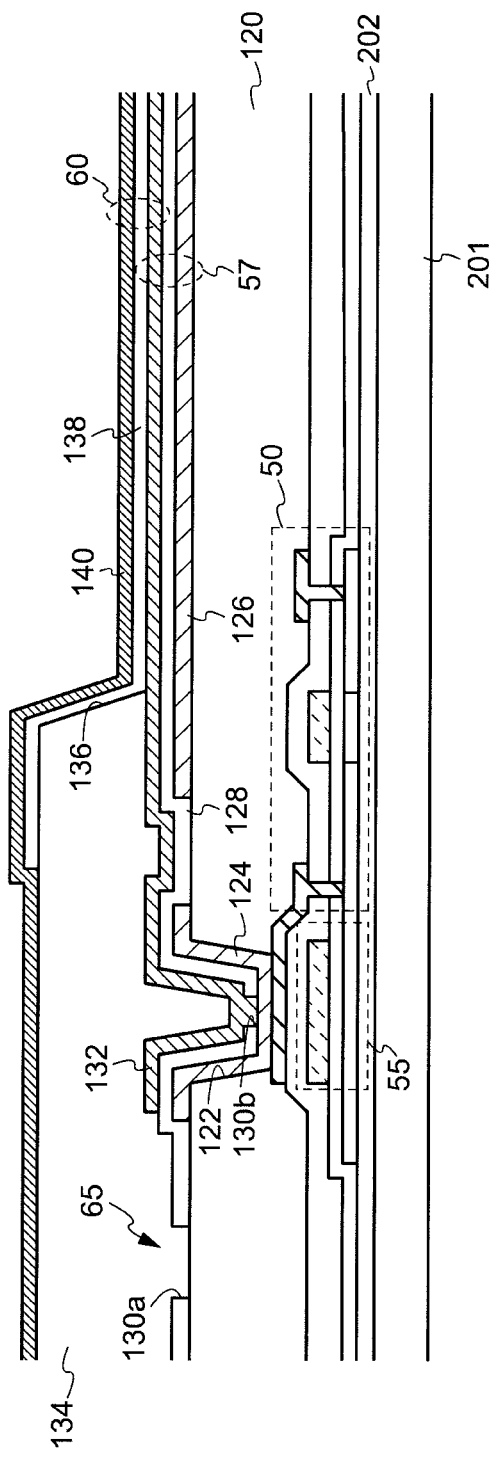
FIG. 10 is a cross-sectional diagram showing a manufacturing process of a display device according to the first embodiment.

Next, a method for manufacturing the organic EL display device 100 of the present embodiment is explained. FIG. 6, FIG. 7. FIGS. 9 and 10 are cross-sectional diagrams views showing the manufacturing steps of the organic EL display device 100 according to the first embodiment. FIG. 8 is a diagram showing a formation process of the pixel electrode 132 in the first embodiment.

First, as shown in FIG. 6, a thin film transistor 50 and a storage capacitor 55 are formed above a support substrate 201. The formation method of the thin film transistor 50 and the storage capacitor 55 is not particularly limited and can be formed by a known method. Although a glass substrate is used in the present embodiment, another insulating substrate may be used as the support substrate 201.

Furthermore, in the case when a flexible substrate formed from a resin material is used as the support substrate 201, a resin film such as polyimide is formed on a support substrate such as a glass substrate, and the thin film transistor 50 and the storage capacitor 55 are formed on the resin film. In addition, after the first sealing film 142a, the second sealing film 142b, and the third sealing film 142c shown in FIG. 2 are finally formed, the resin film may be peeled off from the support substrate.

In the present embodiment, a base film 202 is arranged above the support substrate 201, and the semiconductor film 50a is formed thereon. Next, a gate insulating film 50b which covers the semiconductor film 50a is formed. After the gate insulating film 50b is formed, the gate electrode 50c is formed in a region which overlaps the semiconductor film 50a above the gate insulating film 50b. Furthermore, at the same time as the formation of the gate electrode 50c, the capacitor electrode 50d which forms a part of the storage capacitor 55 is formed.

Next, an insulating film 50e which covers the gate electrode 50c and the capacitor electrode 50d is formed, and next a source electrode 50f and a drain electrode 50g which are connected to the semiconductor film 50a through contact holes (not shown in the diagram) are formed in the insulating film 50e. At this time, the source electrode 50f is formed so as to overlap the capacitor electrode 50d in a planar view. In this way, the thin film transistor 50 and the storage capacitor 55 are formed on the support substrate 201.

Next, as shown in FIG. 7, after forming the thin film transistor 50 and the storage capacitor 55, the organic insulating film 120 is formed. In the present embodiment, a positive photosensitive acrylic resin material is used as the material for forming the organic insulating film 120. More specifically, after an acrylic resin material is used for forming the insulating film 120 is applied, a region where the opening part 122 is formed is selectively exposed by photolithography to perform patterning, so that unnecessary acrylic resin material is removed. In this way, it is possible to form the organic insulating film 120 having the opening part 22 without performing an etching process. Furthermore, the opening part 122 as is shown in FIG. 7, is formed to expose a part of the thin film transistor 50 (specifically, the source electrode 50f).

Next, after the opening part 122 is formed, the oxide conductive film 124 formed from a metal oxide material such as ITO and the lower electrode 126 of the storage capacitor 57 are formed so as to cover the opening part 122. The oxide conductive film 124 and the lower electrode 126 are formed by patterning an oxide conductive film such as ITO to cover the organic insulating film 120 using photolithography. At this time, the oxide conductive film 124 is electrically connected to the source electrode 50f of the thin film transistor 50. The lower electrode 126 is arranged in a region where the organic EL element 60 is formed later.

Next, an inorganic insulating film 128 is formed after the oxide conductive film 124 and the lower electrode 126 are formed. In the present embodiment, a silicon nitride film is formed as the inorganic insulating film 128. In addition, an opening part 130a which exposes a part of the organic insulating film 120 and an opening part 130b which that exposes a part of the oxide conductive film 124 are formed in the inorganic insulating film 128. Furthermore, the inorganic insulating film 128 is an organic film which functions as a protective film for preventing moisture produced from the organic insulating film 120 from affecting the organic EL element 60, and also functions as a dielectric which forms the storage capacitor 57.

The conductive film 41 is formed on the inorganic insulating film 128 after the opening 130a and the opening 130b are formed in the inorganic insulating film 128. The conductive film 41 has a stacked structure in which the IZO thin film 132a, the silver thin film 132b, and the IZO thin film 132c shown in FIG. 3 are formed. That is, the conductive film 41 forms a pixel electrode 132 by an etching process described later.

Next, a resist mask 42 is arranged on the conductive film 41. Following this, wet etching is performed on the conductive film 41 to form the pixel electrode 132. Since the conductive film 41 has a thin film including silver with a low ionization tendency, a solution containing a strong oxidizing power is used as the etchant in the wet etching process. Specifically, in the present embodiment, the conductive film 41 is etched using a mixed acid. The mixed acid here refers to a liquid in which concentrated sulfuric acid and concentrated nitric acid are mixed at a volume ratio of 3:1. Furthermore, although a mixed acid is exemplified in the present embodiment, a liquid obtained by mixing oxalic acid with mixed acid may also be used or another etching solution may be used.

At this time, as is shown in FIG. 8, the wet etching process of the conductive film 41 is performed in a state in which the support substrate 201 is tilted obliquely. Specifically, in the wet etching process of the present embodiment, the support substrate 201 which is formed with the conductive film 41 is formed is held obliquely so as to form an angle θ with respect to a horizontal plane 44. Next, a method is adopted in which an etching solution is flowed from the upper side to the lower side of the support substrate 201 along the direction D1 while the support substrate 201 is held obliquely. In the case shown in FIG. 8, the etching solution flows from above to below along the arrow 45 indicated by a double dotted line. In the explained below, when explaining a position in the D1 direction, it may be expressed as "upstream side" or "downstream side" of the etching solution.

Furthermore, in general, when forming a display device on a support substrate, a plurality of display devices are simultaneously formed using a large support substrate. In the case shown in FIG. 8, a plurality of device formation regions 46 are arranged on the support substrate 201 each are formed with a conductive film 41 and a resist mask 42 shown in FIG. 7. Therefore, according to the stricture in FIG. 8, the wet etching process can be collectively performed on the conductive film 41 which is formed in all the device formation regions 46 on the support substrate 201.

In FIG. 8, the etching solution which flows from the upstream side first etches the conductive film 41 formed in each device formation region 46 from the upstream side. Since it is not necessary to form the pixel electrode 132 in a region other than the pixel region 20, the resist mask 42 is not arranged. Therefore, the conductive film 41 is not present in a region other than the pixel region 20.

On the other hand, when the etching process reaches the pixel region 20, the conductive film 41 is etched along the shape of the resist mask 42 thereby the pixel electrode 132 is formed with a predetermined shape. Here, in the conventional art, since the etching solution quickly passes downward in the vicinity of the side located on the upstream side of the etching solution in the pixel region, it is easy for a silver thin film residue remains when the pixel electrode is formed. In this way, in the present embodiment, the first pixel electrode 132A which has a zigzag shaped side 31 as is shown in FIG. 4A and Fig. is 4B is formed on a side located on the upstream side in which the etching solution flows among the sides which form the pixel region 20.

As was explained above using FIG. 4A and FIG. 4B, since the side 31 of the first pixel electrode 132A has a zigzag shape, the etchant easily stays in the gap between two adjacent first pixel electrodes 132A. In particular, in the present embodiment, the zigzag shaped side 31 includes a projecting part 36 which projects in the direction in which the etching solution flows. In this way, a pocket for retaining the etching solution is formed in the gap between the two adjacent first pixel electrodes 132A, and the etching solution can be retained more efficiently.

In this way, it is possible for an etching solution to be retained between zigzag shaped sides 31 and suppress the formation of residue on the silver thin film 132b. Furthermore, in the present embodiment while an example was exemplified in which the first pixel electrode 132A which is formed in the first row on the most upstream side, the first pixel electrode 132A may also be formed over a plurality of rows. In addition, in the case when the outermost periphery of the pixel region 20 is a dummy pixel, an electrode included in the dummy pixel (an electrode corresponding to pixel electrode) may play the role of the first pixel electrode 132A.

After formation of the first pixel electrode 132A, the etching solution flows further downward and the etching process proceeds. As the etching process proceeds, the conductive film 41 is gradually etched from the upstream side, and the second pixel electrode 132B is sequentially formed. Furthermore, the etching solution tends to quickly pass downwards in the vicinity of the side located on the upstream side of the etching solution in the pixel region 20. However, since the progress of the etchant becomes slower when the etchant advances to a certain extent to the center side of the pixel region 20, there is no problem even if the zigzag shaped side 31 is not arranged as in the first pixel electrode 132A.

Through the process described above, the pixel electrode 132 is formed as is shown in FIG. 9. The pixel electrode 132 is electrically connected to the oxide conductive film 124 on the inner side of the opening 130b. In other words, the pixel electrode 132 is electrically connected to the thin film transistor 50 via the oxide conductive film 124.

At this time, the region where the organic insulating film 120 is exposed on the inner side of the opening part 130a functions as a drain region 65 shown in FIG. 2. That is, in the case when a heat treatment is performed after the opening 130 a is formed, moisture which has evaporated inside the organic insulating film 120 is output to the exterior through the drain region 65.

In addition, by forming the pixel electrode 132, the storage capacitor 57 formed by the lower electrode 126, the inorganic insulating film 128 and the pixel electrode 132 is formed. In the present embodiment, although not shown in the diagram, the storage capacitor 57 is arranged between the gate electrode 50c and the source electrode 50f of the thin film transistor 50 which is formed by an N-channel transistor. That is, the lower electrode 126 which is one electrode of the storage capacitor 57 is connected to the gate electrode 50c. In addition, the pixel electrode 132 which is the other electrode of the storage capacitor 57 is connected to the source electrode 50f.

Next, a bank 134 is formed from of a resin material after the pixel electrode 132 is formed, as is shown in FIG. 10. In the present embodiment, a photosensitive acrylic resin material is used as a material which forms the bank 134. The bank 134 is patterned so as to cover the outer edge of the pixel electrode 132 and expose the upper surface of the pixel electrode 132. The opening part 136 which is formed by this patterning defines a region (light emitting region) which functions as the organic EL element 60 on the upper surface of the pixel electrode 132.

When the bank 134 is formed, next the organic EL layer 138 and the common electrode 140 are formed. In the present embodiment, although an example is exemplified in which the organic EL layer 138 and the common electrode 140 are formed using a vapor deposition method and divided for each pixel but the present invention is not limited to this. For example, a functional layer such as an electron transport layer or a hole transport layer other than a light emitting layer may be arranged in common for a plurality of pixels. There is no particular limitation to the organic electroluminescent layer 138 which can be used in this embodiment, and it is possible to use a well-known material.

In the present embodiment, a conductive film (MgAg film) formed from an alloy including magnesium and silver is used as the common electrode 140. This is a type of conductive film which includes an alkali metal or an alkaline earth metal is weak to moisture similar to the organic EL layer 138. As a result, it is desirable to perform vapor deposition of the organic EL layer 138 and the common electrode 140 without opening the layers to the atmosphere. In this case, although it is preferred to continuously perform the vapor deposition process while maintaining a vacuum, the present embodiment is not limited to this, it is also effective to continuously perform the vapor deposition process while maintaining an inert atmosphere such as a nitrogen atmosphere.

At this point, the pixel electrode 132, and the organic EL element 60 formed from the organic EL layer 138 and the common electrode 140 is formed on the inner side of the opening 136 arranged in the bank 134.

Next, a first sealing film 142a formed from a silicon nitride film, a second sealing film 142b formed form a resin material, and a third sealing film 142c formed from a silicon nitride film are stacked in this order to obtain the structure shown in FIG. 2. At this time, the second sealing film 142b can planarize the unevenness caused by the opening part 136 which is formed in the bank 134.

Furthermore, even if foreign matter such as particles exist on the common electrode 140, since it is possible to planarize unevenness using the second sealing film 142, it is possible to peel off the effects of foreign matter by the third sealing film which is formed above the second sealing film 142b and reduce the occurrence of coverage defects.

Second Embodiment

In the present embodiment, an example in explained in which the arrangement of the first pixel electrode 132A in the pixel region 20 is different from that in the first embodiment. In the present embodiment, parts common to the organic EL display device 100 of the first embodiment may be attached with the same reference numerals and an explanation may be omitted.

In the first embodiment, an example was exemplified in which the first pixel electrode 132A was arranged for one row along a side located on the upstream side in which the etching solution flows among the sides of the pixel region 20. That is, in the first embodiment, as shown in FIG. 4A, an example was shown in which the first pixel electrode 132A is located on the outermost periphery of the pixel region 20. On the other hand, in the present embodiment, an example is shown in which the first pixel electrode 132A is arranged not only on the outermost periphery of the pixel region 20 but also on the center side of the pixel region 20.

Figure 11A:
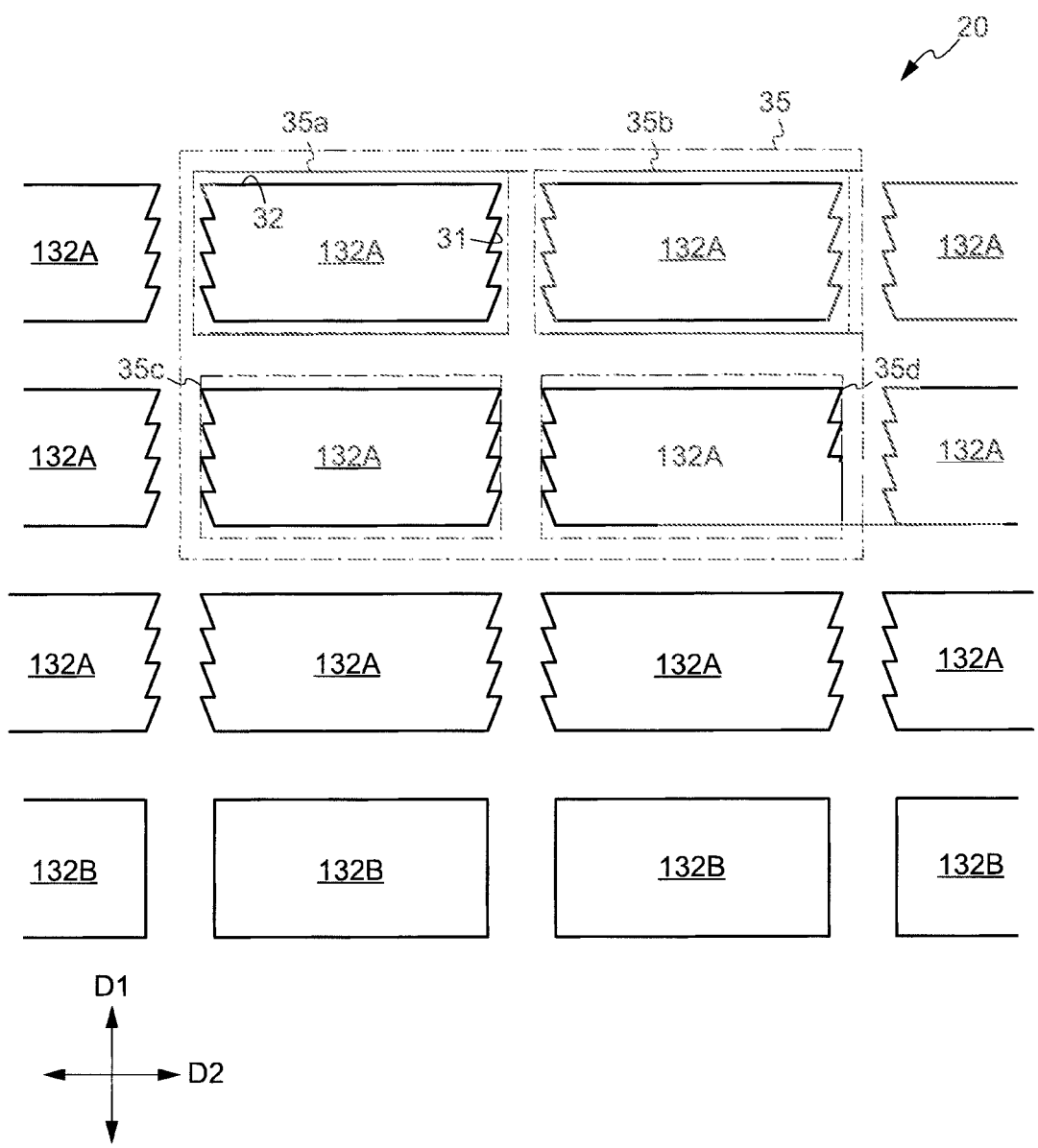
FIG. 11A is a planar diagram showing a structure of a pixel region according to the second embodiment.

FIG. 11A is a planar view showing a structure of the pixel region 20 in the second embodiment. As is shown in FIG. 11A, in the present embodiment, a plurality of rows from the outermost periphery of the pixel region 20 are formed by the first pixel electrodes 132A. Specifically, in FIG. 11A, although the first pixel electrode 132A is formed from the outermost periphery to the third row of the pixel region 20, the present invention is not limited to this structure.

In the present embodiment, when forming the pixel electrode 132, the etching solution is retained by the first pixel electrodes 132A in a plurality of rows. That is, it is possible to retain the etching solution for a longer time than the structure of the first embodiment in the vicinity of one side located on the upstream side of the etching solution among each side of the pixel region 20. As a result, it is possible to further reduce the etching residue of the silver thin film 132b which forms the pixel electrode 132.

In the present embodiment, although an example is exemplified in which the outermost periphery to the third row of the pixel region 20 are formed by the first pixel electrode 132A, the present embodiment is not limited to this structure. Of course, all the pixel electrodes 132 which are arranged in the pixel region 20 can be configured by the first pixel electrodes 132A.

Figure 11B:
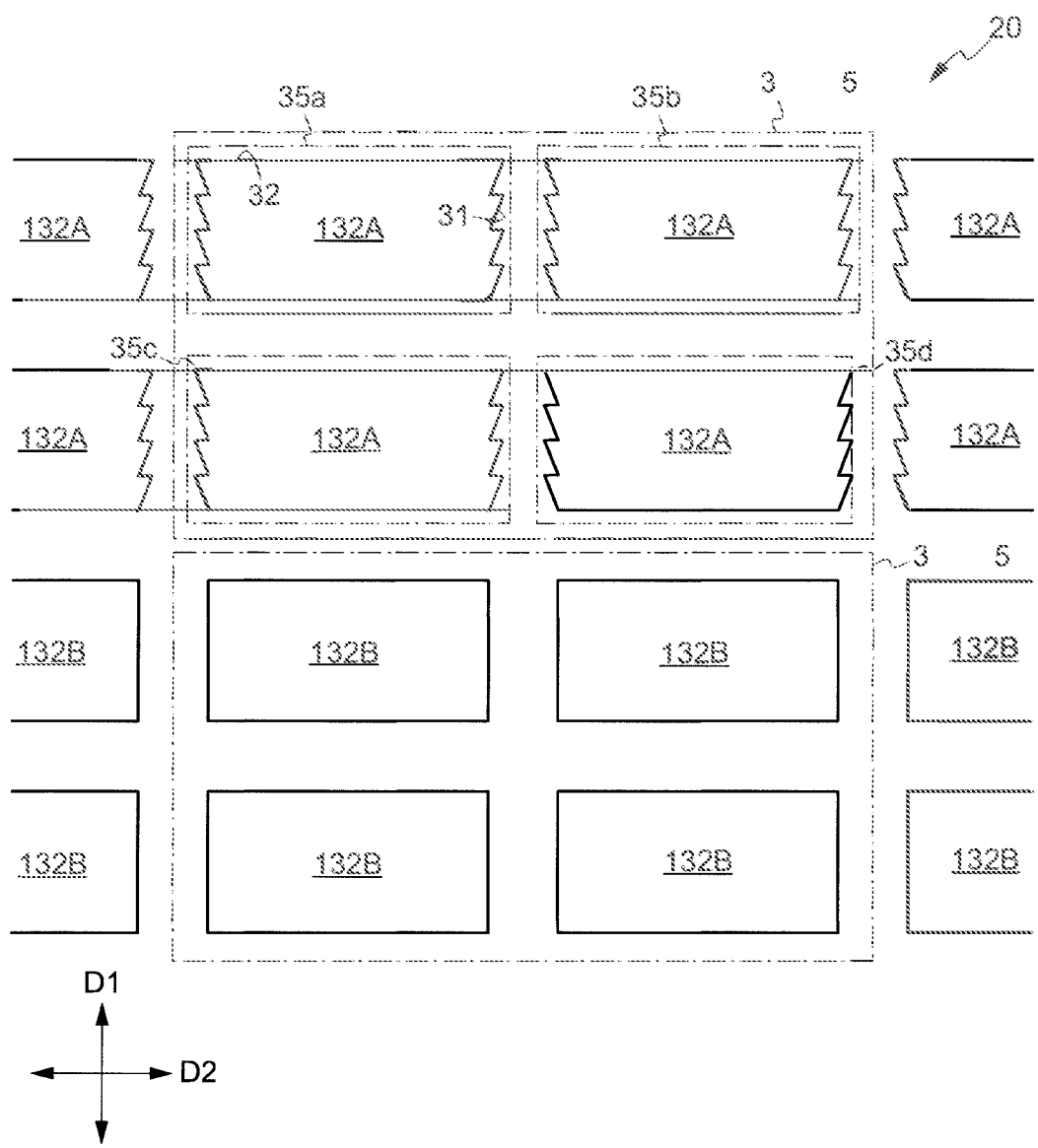
FIG. 11B is a planar diagram showing a structure of a pixel region according to the second embodiment.

In addition, as a modified example of the present embodiment, the outline of the pixel electrode 132 can be made different with the main pixel 35 as a unit. Here, FIG. 11B is a planar view showing a structure of the pixel region 20 in the second embodiment. In FIG. 11B, from the outermost periphery to the second row of the pixel region 20 is the first pixel electrode 132A, and from the outermost periphery to the third and subsequent rows is the second pixel electrode 132B. That is, the outline of the pixel electrode 132 is different for each main pixel 35. Therefore, according to the example in FIG. 11B, it is also possible that from the outermost periphery to the fourth row of the pixel region 20 is the first pixel electrode 132A, from the outermost periphery to the fifth and subsequent rows can be second pixel electrode 132B.

Third Embodiment

In the present embodiment, an example is explained in which the shape (outline) of the first pixel electrode in a planar view is different from that of the first embodiment. In the present embodiment, parts which are common to the organic EL display device 100 of the first embodiment may be attached with the same reference numerals and a description may be omitted.

FIG. 12A to FIG. 12D are diagrams for explaining the shape (outline) of a pixel electrode in the third embodiment. Furthermore, although FIG. 12A to FIG. 12D only explain four subpixels for the convenience of explanation, the pixel region 20 has many subpixels. In addition, although an example is exemplified in which only the pixel electrode located at the outermost periphery of the pixel region 20 is the first pixel electrode, a pixel electrode at an arbitrary position may also be used as the first pixel electrode as in the second embodiment.

Figure 12A:
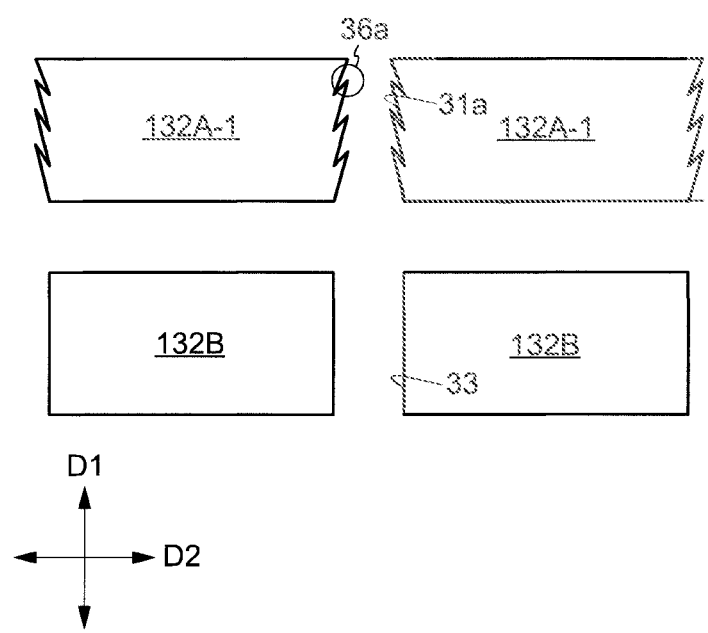
FIG. 12A is a diagram for explaining a shape of a pixel electrode according to the third embodiment.

In FIG. 12A, a first pixel electrode 132A-1 has a zigzag shaped side 31a. The side 31a has a projecting part 36a which forms an acute angle with respect to the direction D1 compared with the side 31 shown in FIG. 4A and FIG. 4B. As a result, the etchant which flows from above in FIG. 12A can remain longer in the vicinity of the side 31a.

Figure 12B:
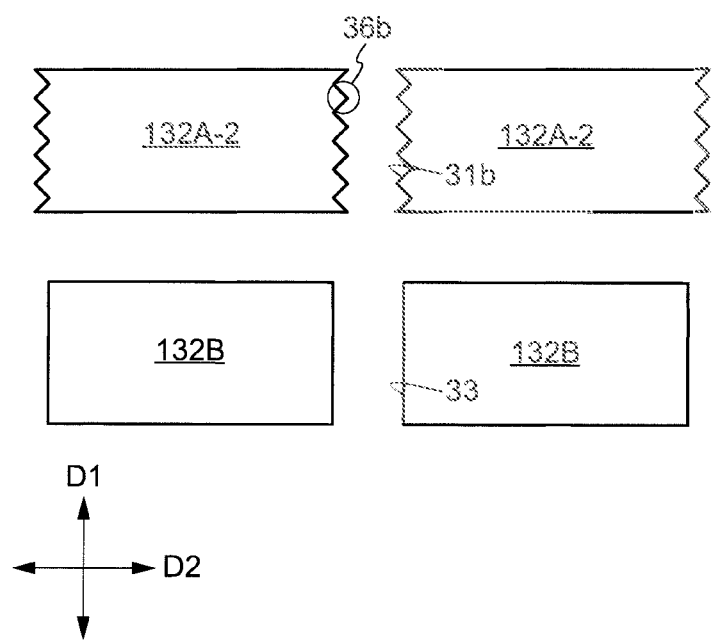
FIG. 12B is a diagram for explaining a shape of a pixel electrode according to the third embodiment.

In FIG. 12B, a first pixel electrode 132A-2 has a zigzag shaped side 31b. The side 31b has a projecting part 36b which forms an obtuse angle with respect to the direction D1 compared to the side 31 shown in FIG. 4A and FIG. 4B. Even with such a shape, since a gap having a different width is formed in the gap between adjacent first pixel electrodes 132A-2, it is possible to retain an etching solution.

Figure 12C:
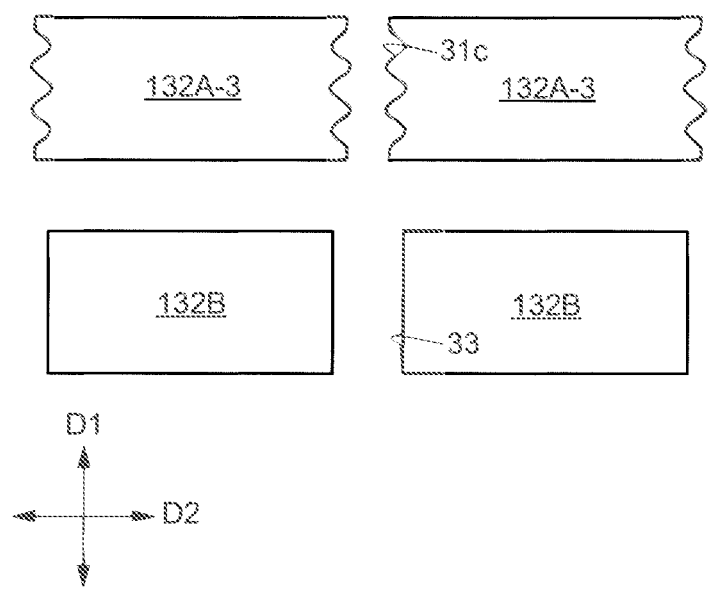
FIG. 12C is a diagram for explaining a shape of a pixel electrode according to the third embodiment.

In FIG. 12C, a first pixel electrode 132A-3 has a wave shaped side 31c. Even with such a shape, since a gap having a different width is formed in the gap between adjacent first pixel electrodes 132A-3, it is possible to retain an etching solution.

Figure 12D:
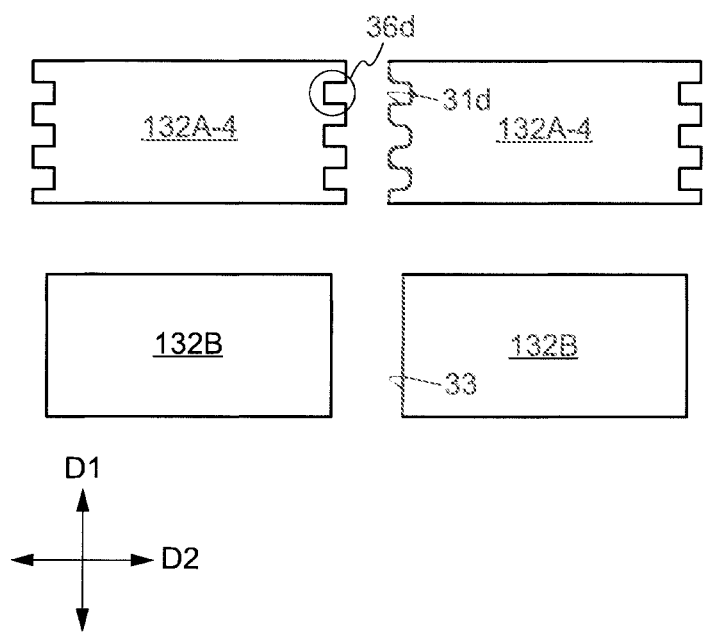
FIG. 12D is a diagram for explaining a shape of a pixel electrode according to the third embodiment.

In FIG. 12D, a first pixel electrode 132A-4 has a rectangular uneven side 31d. Even with such a shape, since a gap having a different width is formed in the gap between adjacent first pixel electrodes 132A-4, it is possible to retain an etching solution. In addition, since the part 36d which corresponds to the rectangular uneven parts functions as a pocket in which the etching solution accumulates, the etching solution can remain in the vicinity of the side 31d for a longer time.

Fourth Embodiment

In the present embodiment, an example is explained in which the shape (outline) of the first pixel electrode in a planar view is different from that of the first and third embodiments. Furthermore, in the present embodiment, parts which are common to the organic EL display device 100 of the first embodiment may be attached with the same reference numerals and an explanation may be omitted.

Figure 13:
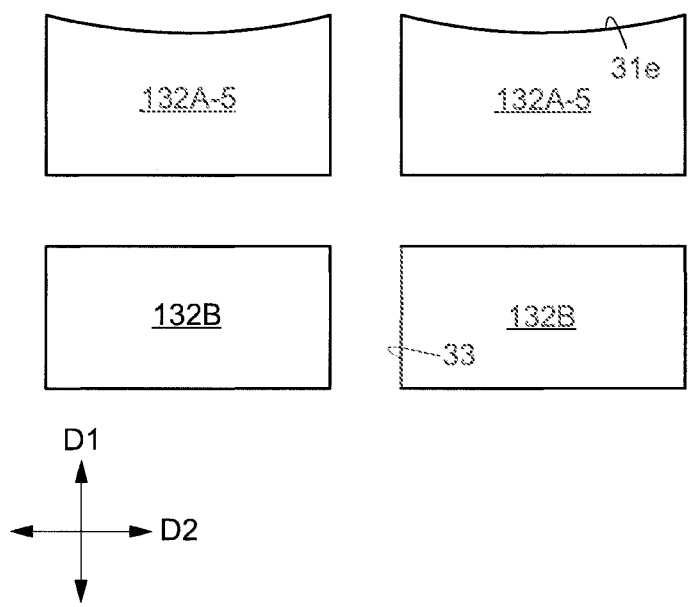
FIG. 13 is a diagram for explaining a shape of a pixel electrode according to the fourth embodiment.

FIG. 13 is a diagram for explaining the shape (outline) of a pixel electrode in the fourth embodiment. Furthermore, in FIG. 13, although only four subpixels are explained for convenience, the pixel region 20 has many subpixels. In addition, although an example is exemplified in which only the pixel electrode located at the outermost periphery of the pixel region 20 is the first pixel electrode, a pixel electrode at an arbitrary position may also be used as the first pixel electrode as in the second embodiment.

In FIG. 13, a first pixel electrode 132A-5 has a curved shaped side 31e. Specifically, the side 31e forms a recess part toward the direction in which the etching solution flows. As a result, the etching solution which has flowed from above in the direction D1 accumulates in the vicinity of the side 31e. Therefore, it is possible to prevent the etching residue of the silver thin film 132b remaining in the vicinity of the side 31e.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

In addition, although each of the embodiments described above was explained using the shape of a pixel electrode as an example of the embodiment of the present invention, it is possible to apply the present invention to an entire display device arranged with an electrode having a feature in which a residue tends to remain after etching similar to a thin film containing silver or a silver alloy. That is, the present invention can be applied to a display device having a region in which a plurality of electrodes are arranged in a matrix.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
a region arranged with a plurality of electrodes in a matrix,
wherein
the plurality of electrodes includes a plurality of first electrodes located along any one side of the region and a plurality of second electrodes located closer to the center of the region than the plurality of first electrodes, the first electrodes and the second electrodes are located in the same layer, the first electrodes comprise a conductive material which is the same as that of the second electrodes, the first electrode and the second electrode have a different outline in a planar view, and the outline of the plurality of first electrodes includes a side having a zigzag shaped side or concave/convex shape.

2. The semiconductor device according to claim 1, wherein a gap between two adjacent first electrodes among the plurality of first electrodes includes a first gap and a second gap narrower than the first gap.

3. The semiconductor device according to claim 1 wherein a gap between two adjacent first electrodes among the plurality of first electrodes includes a part narrower than a gap between two adjacent second electrodes among the plurality of second electrodes.

4. The semiconductor device according to claim 1, wherein a gap between two adjacent first electrodes among the plurality of first electrodes and a gap between two adjacent second electrodes among the plurality of second electrodes are located on the same straight line.

5. The semiconductor device according to claim 1, wherein the plurality of first electrodes is located in the outermost periphery of the region.

6. The semiconductor device according to claim 1, wherein the plurality of electrodes is formed by a metal material including silver or a silver alloy.

7. The semiconductor device according to claim 1, wherein a side along a first direction among the outline of the plurality of first electrodes has a zigzag shape or a concave/convex shape, and a side along a second direction intersecting the first direction among the outline of the plurality of first electrodes has a straight line shape.

8. The semiconductor device according to claim 1, wherein the side having a zigzag shape or a concave/convex shape includes a projecting part projecting towards the side of the region along which the plurality of first electrodes are located.

9. A display device comprising:

a pixel region having a plurality of pixel electrodes arranged in a matrix, wherein the plurality of pixel electrodes includes a plurality of first pixel electrodes located along any one side of the region and a plurality of second pixel electrodes located closer to the center of the region than the plurality of first pixel electrodes, the first pixel electrodes and the second pixel electrodes are located in the same layer, the first pixel electrodes comprise a conductive material which is the same as that of the second pixel electrodes, the first pixel electrode and the second pixel electrode have a different outline in a planar view, and the outline of the plurality of first pixel electrodes includes a side having a zigzag shaped side or concave/convex shape.

10. The display device according to claim 9, wherein a bank is further provided including an opening covering an end part of the plurality of pixel electrodes and exposing an upper surface of each of the plurality of pixel electrodes, and an outline of the opening does not overlap the zigzag shaped side or a side having a concave/convex shape.

11. The display device according to claim 9, wherein a bank is further provided including an opening covering an end part of the plurality of pixel electrodes and exposing an upper surface of each of the plurality of pixel electrodes, and a shape of the opening formed above the first pixel electrode and a shape of the opening formed above the second pixel electrode is equal.

12. The display device according to claim 9, wherein each of the plurality of pixel electrodes forms a sub-pixel respectively and one main pixel is formed by a plurality of the sub-pixels, and any one of the plurality of main pixels includes the first pixel electrode and the second pixel electrode.

13. The display device according to claim 9, wherein the plurality of pixel electrodes is formed by a metal material including silver or a silver alloy.

14. The display device according to claim 9, wherein a side along a first direction among the outline of the plurality of first pixel electrodes has a zigzag shape or a concave/convex shape, and a side along a second direction intersecting the first direction among the outline of the plurality of first pixel electrodes has a straight line shape.

15. The display device according to claim 9, wherein the side having a zigzag shape or a concave/convex shape includes a projecting part projecting towards the side of the region along which the plurality of first pixel electrodes are located.

* * * * *